(12) United States Patent
Laslo et al.

(10) Patent No.: US 11,016,589 B2
(45) Date of Patent: *May 25, 2021

(54) DISCRETE HIGH IMPEDANCE IMPLEMENTATION ON PUSH-PULL OUTPUTS

(71) Applicant: MICROSOFT TECHNOLOGY LICENSING, LLC, Redmond, WA (US)

(72) Inventors: Ori Laslo, Rehovot (IL); Vadim Mishalov, Tel-Aviv (IL); Ron Kaplan, Ness Zyona (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 62 days.

This patent is subject to a terminal disclaimer.

(21) Appl. No.: 16/138,702

(22) Filed: Sep. 21, 2018

(65) Prior Publication Data

US 2019/0025946 A1 Jan. 24, 2019

Related U.S. Application Data

(63) Continuation of application No. 15/471,930, filed on Mar. 28, 2017, now Pat. No. 10,095,329.

(51) Int. Cl.
| | |
|---|---|
| *G06F 3/038* | (2013.01) |
| *G06F 3/0354* | (2013.01) |
| *H03F 3/217* | (2006.01) |
| *H03F 3/24* | (2006.01) |
| *G06F 3/041* | (2006.01) |
| *G06F 3/044* | (2006.01) |

(52) U.S. Cl.
CPC ........ *G06F 3/0383* (2013.01); *G06F 3/03545* (2013.01); *G06F 3/04162* (2019.05); *H03F 3/217* (2013.01); *H03F 3/245* (2013.01); *G06F 3/0441* (2019.05); *G06F 3/0442* (2019.05)

(58) Field of Classification Search
CPC ............................................. G06F 3/033–0395
See application file for complete search history.

(56) References Cited

U.S. PATENT DOCUMENTS

| | | | |
|---|---|---|---|
| 10,095,329 B1* | 10/2018 | Laslo et al. | G06F 3/083 |
| 2004/0109368 A1* | 6/2004 | Kuroda | G11C 7/00 365/200 |
| 2014/0266367 A1* | 9/2014 | Uesugi | H03K 3/012 |
| 2015/0331509 A1* | 11/2015 | Huang et al. | G06F 3/041 |
| 2017/0031465 A1* | 2/2017 | Jung et al. | G06F 3/083 |

* cited by examiner

*Primary Examiner* — Hang Lin
(74) *Attorney, Agent, or Firm* — Arent Fox LLP

(57) ABSTRACT

Methods and devices for communicating or interacting by a pen or a stylus with a digitizer are disclosed. An example method describes determining whether the device is to transmit a first information to the digitizer via the electrode or receive a second information from the digitizer via the electrode. An example device for use with the method includes a transmitter circuit, a receiver circuit, and an electrode. The method further includes isolating the electrode from the transmitter circuit in response to determining that the device is to receive the second information from the digitizer via the electrode.

18 Claims, 8 Drawing Sheets

```
┌─────────────────────────────────────────────────────────────┐
│ Determine, at a device having a transmitter circuit, a receiver circuit, │
│ and an electrode for communicating with the digitizer, whether the │      ─ 810
│ device is to transmit a first information to the digitizer via the electrode │
│ or receive a second information from the digitizer via the electrode │
└─────────────────────────────────────────────────────────────┘
                              │
                              ▼
┌─────────────────────────────────────────────────────────────┐
│ Isolate the electrode from the transmitter circuit in response to │
│ determining that the device is to receive the second information from │   ─ 820
│ the digitizer via the electrode │
└─────────────────────────────────────────────────────────────┘
```

FIG. 8

DISCRETE HIGH IMPEDANCE IMPLEMENTATION ON PUSH-PULL OUTPUTS

CROSS-REFERENCE TO RELATED APPLICATION(S)

This application claims the benefit of U.S. Non-Provisional application Ser. No. 15/471,930, entitled "DISCRETE HIGH IMPEDANCE IMPLEMENTATION ON PUSH-PULL OUTPUTS" and filed on Mar. 28, 2017, which is expressly incorporated by reference herein in its entirety.

BACKGROUND

The present implementations relate to communications or interactions between a pen/stylus and a digitizer, and more particularly, to transmitting or receiving data at the pen/stylus over an electrode from the digitizer.

Electromagnetic pens or styluses are known in the art for use and control of a digitizer. Position detection of the pen provides input to a computing device associated with the digitizer and is interpreted as a user command. Position detection is performed while the pen tip is either touching and/or hovering over a detection surface of the digitizer. Often, the digitizer is integrated with a display screen and a position of the pen over the screen is correlated with information portrayed on the screen.

A digitizer may operate in a search mode or a tracking mode. The digitizer operates in a search mode when there is no communication or contact with the pen, or the communication or contact with the pen is lost and the digitizer is searching for a transmission signal, such as a beacon, from the pen. Once the digitizer finds the transmission signal from the pen, the digitizer performs a synchronization with the pen and the digitizer transitions to a tracking mode. In the tracking mode, the digitizer is in synchronization with the transmission signal from the pen and can receive information from the pen.

For example, in a typical pen/digitizer application, a high voltage alternate current (AC) signal is transmitted by the pen over an electrode and detected by the digitizer. If the pen has to receive a signal from the digitizer over the same electrode, the electrode has to be shared, and the pen may encounter some issues during the sharing of the electrode.

Therefore, there is a need for an improved mechanism to share an electrode for transmitting data to a digitizer and receiving data from the digitizer.

SUMMARY

The following presents a simplified summary of one or more disclosed features in order to provide a basic understanding of the disclosure. This summary is not an extensive overview of all contemplated implementations, and is intended to neither identify key or critical elements of all implementations nor delineate the scope of any or all implementations of the present disclosure. Its sole purpose is to present some concepts of one or more features of the present disclosure in a simplified form as a prelude to the more detailed description that is presented later.

One implementation relates to a method of communicating with a digitizer. The method may include determining, at a device having a transmitter circuit, a receiver circuit, and an electrode for communicating with the digitizer, whether the device is to transmit a first information to the digitizer via the electrode or receive a second information from the digitizer via the electrode and isolating the electrode from the transmitter circuit in response to determining that the device is to receive the second information from the digitizer via the electrode.

In another implementation, a device for communicating with a digitizer may include a pulse generator, a transmitter circuit, a receiver circuit, an electrode for communicating with the digitizer, a memory, and a processor in communication with the memory, wherein the processor is configured to determine whether the device is to transmit a first information to the digitizer via the electrode or receive a second information from the digitizer via the electrode; and isolate the electrode from the transmitter circuit in response to determining that the device is to receive the second information from the digitizer via the electrode.

In a further implementation, a computer-readable medium storing computer-executable instructions executable by a processor for communicating with a digitizer includes various instructions. The computer-readable medium includes instructions for determining, by a device having a transmitter circuit, a receiver circuit, and an electrode for communicating with the digitizer, whether the device is to transmit a first information to the digitizer via the electrode or receive a second information from the digitizer via the electrode, and for isolating the electrode from the transmitter circuit in response to determining that the device is to receive the second information from the digitizer via the electrode.

Additional advantages and novel features relating to features of the present disclosure will be set forth in part in the description that follows, and in part will become more apparent to those skilled in the art upon examination of the following or upon learning by practice thereof.

DETAILED DESCRIPTION

The addition of a high impedance mode to a high voltage push-pull driver is very expensive in terms of cost, power, and/or size, and adds a significant amount of parasitic capacitance. For example, in a typical digital pen or stylus application, a high voltage alternating current (AC) signal is transmitted by the pen, over an electrode, to a digitizer. However, if the pen has to receive a signal from the digitizer over same electrode, the pen has to be capable of switching the high voltage push-pull driver to a high impedance mode and with very low parasitic capacitance.

The present disclosure provides a method, a device, and/or instructions in a computer readable medium for communicating with a digitizer. The device (e.g., a pen or a stylus) communicates/interacts with the digitizer by determine whether the device to transmit information to the digitizer or receive information from the digitizer via an electrode. The device isolates the electrode from a transmitter circuit of the device in response to determining that the device is to receive information from the digitizer via the electrode.

Figure 1:
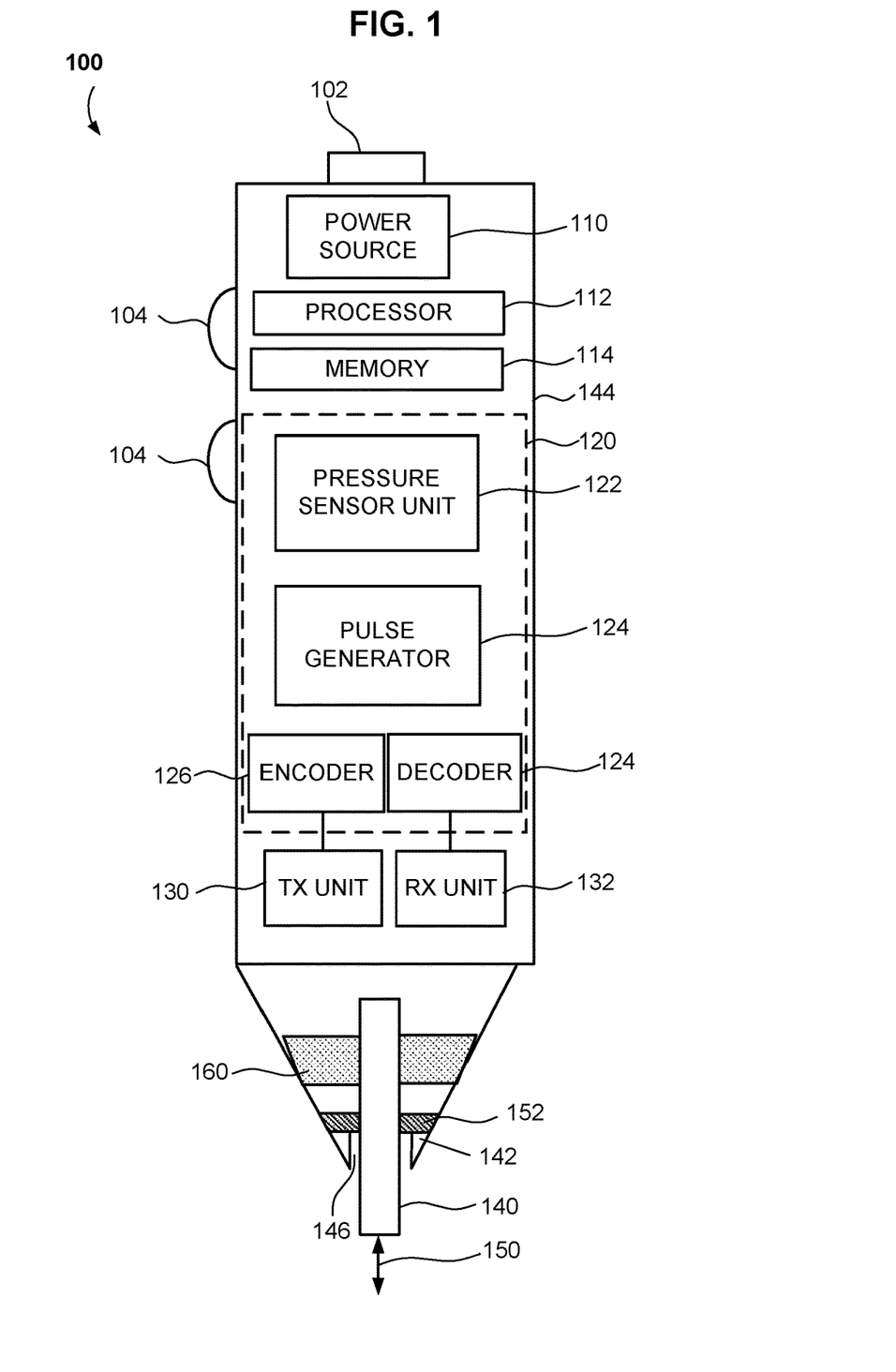
FIG. 1 is a schematic view of an example of a pen.

Referring to FIG. 1, according to an example implementation, a pen 100 (which may also be referred to as a stylus) may be an autonomous asynchronous device that can communicate or interact with the digitizer, for example, to transmit data (e.g., a first information) to the digitizer and/or receive data (e.g., a second information) from the digitizer, is described herein. The pen 100 can transmit pulses of energy that can represent beacon signals and/or commands generated by the pen 100. For example, a transmitting unit (TX unit) 130 of the pen 100 may transmit an electric signal generated by a pulse generator 124. In some cases, the pulse generator 124 generates one or more AC signal bursts providing pulsed signals (AC pulses), e.g., a train of pulses (signal bursts). For example, the AC pulses may be generated within a certain frequency range, such as but not limited to a frequency range between 20-40 KHz. The AC pulses may use a frequency other than the frequencies generally used to detect finger touch on a digitizer. Additionally, for example, the frequency of a burst signal from the pen 100 may be orthogonal to the frequencies used to detect finger touch in the sampling space or far enough away so that simultaneous user interactions (e.g., pen and finger) may be possible. Also, in some implementations, specific time slots for finger touch detection and pen detection may be defined to avoid interference or misidentification when close frequencies are used. In some cases, the pulse generator 124 generates pulses over a defined time duration or pulse width. An example pulse width may be between 1-2 milliseconds (msec), such as but not limited to 1.28 msec. In some additional implementations, for example, the pen 100 can receive an electrical signal which may include information (e.g., the second information) received and processed by a receiving unit (RX unit) 132.

The TX unit 130 can transmit data to the digitizer and/or the RX unit 132 can receive data from the digitizer via an electrode 160 and/or tip 140. In one example, the TX unit 130 and the RX unit 132 can transmit/receive over a single electrode, e.g., electrode 160 or the tip 140, in a time division multiplexing (TDM) manner. In another example, the TX unit 130 can transmit data over one electrode (e.g., a first electrode) and receive data over a different electrode (e.g., a second electrode). However, depending on the configuration of the pen 100 and the digitizer, the TX unit 130 and the RX unit 132 can communicate with the digitizer over the first electrode and the second electrode in a TDM manner or at the same time (e.g., simultaneously).

The pen 100 may include a processor 112, a memory 114, and powered by a power source 110. The power source 110 may include one or more batteries, e.g., alkaline or rechargeable batteries.

In some cases, the pen 100 may include a power switch 102 for powering transmission of the pen 100 and one or more operational switches and/or dials 104 for receiving operation commands from a user. For instance, the switches 104 may control right click and eraser mode commands as well as color selection when writing or drawing with the pen. In some other additional or optional implementations, a rocker switch may be used for right click or eraser operation. That is, at least one of the switches 104 may be a rocker switch.

The pen 100 may include a tip 140 that operates as an antenna of the TX unit 130, and/or an electric dipole, and/or the tip 140 may be used to transmit/receive data to/from the digitizer. For example, the tip 140 may transmit beacons for tracking the position of the pen 100 and pressure information. For example, one output of the pulse generator 124 is electrically connected to the pen tip 140 (which may be constructed from a conductive material) while the other end is electrically connected to a frame 142 (which may comprise conductive material) surrounding the tip 140. The frame 142 may be integral to a housing unit 144 and is grounded. An electric field, synchronized to a generated signal pulse, may be formed in a small gap 146 located between the tip 140 and the frame 142. In some implementations, the geometric dimensions of the gap and the consequent electric field may be relatively small so that field source may be substantially close to the pen tip and may provide a concentrated signal at the tip. Further, the signals transmitted by the pen 100 may be picked up at relatively concentrated points by the digitizer or other sensing surface and the position of the pen at that position may be conveyed to the digitizer. In some other optional implementations, the pen 100 may include a separate antenna and may not use the tip 140 for transmitting the output signals.

The pen 100 may be a pressure sensitive pen that may transmit information regarding contact pressure applied to the tip 140. For instance, the pen 100 may include a pressure unit 12 in communication with the tip 140 and configured to detect contact force (or contact pressure) applied to the tip 140. In some cases, the tip 140 may be fixedly connected to the pen 100, while in other cases, the tip 140 is movably connected to the pen 100 to allow the tip 140 to translate in the axial direction 150, e.g., along the longitudinal axis of the tip 140. For example, in the movably connected cases, the tip 140 recedes into the housing unit 144 along an axial direction 150 in response to a user pressing the tip 140 on a surface, and the tip 140 may move in a direction away from the housing unit 144 when the contact pressure is released, e.g., in a hovering state or non-operational state of the pen 100. In some cases, during the axial movement, the tip 140 is engaged with a resilient element 152, e.g., a spring whose properties are generally selected to obtain a desired relationship between the contact pressure and the axial displacement.

Pressure sensor unit 122 senses contact pressure applied to the tip 140 and provides this pressure information to pulse generator 124. The pulsate generator 124, based on the sensed contact pressure level, defines or alters a frequency of a pulse, and generates and initiates transmission of the defined or the altered pulse. In some other additional or optional cases, a specific frequency band may be allocated for transmitting the pressure information. For example, a frequency band of 20-45 KHz, e.g., 20-25 KHz, may be allocated for transmitting the pressure information. Additionally, output from the pressure sensor unit 122 may be encoded with an encoder 126 for the pulses generated by pulse generator 124.

The pen 100 may include an encoder 126, such as but not limited to a digital encoder, operable to encode an operational state of the pen 100 and/or identification information of the pen 100 into a pulse generated by the pulse generator 124. The operational state of the pen 100 may be obtained from switch state of the switches 102, and/or the pressure state of the pen 100 may be encoded with the encoder 126. One or more encoding methods (e.g., Amplitude Shift Keying (ASK), Phase Shift Keying (PSK), Frequency Shift Keying (FSK), etc.) may be used to encode information with the encoder 126. The encoded information from the pen may be transmitted over a plurality of transmission cycles. For instance, in some implementations, one bit of encoded information may be transmitted per transmission cycle. In some other implementations, the pulse generator 124, the encoder 126, the pressure sensor unit 122, and/or their functionality may be embedded in an ASIC unit 120. In addition, the pen 100 may include a decoder 166, such as but not limited to a digital decoder, operable to decode a digital stream from the RX unit 132 into the second information, and pass on the second information to the processor 112 for processing.

In some cases, a time between pulses may match a refresh cycle of a digitizer or an integer multiple of a refresh cycle of a digitizer, e.g., twice a refresh cycle of a digitizer and/or three or four times a refresh frequency of a digitizer. Alternatively or in addition, a time between pulses (or bursts) may be variable and may be controllably altered based on an operational state of the digitizer. For instance, in an implementation, the time between pulses at the pen 100 may be configured for 15 msec.

Figure 2:
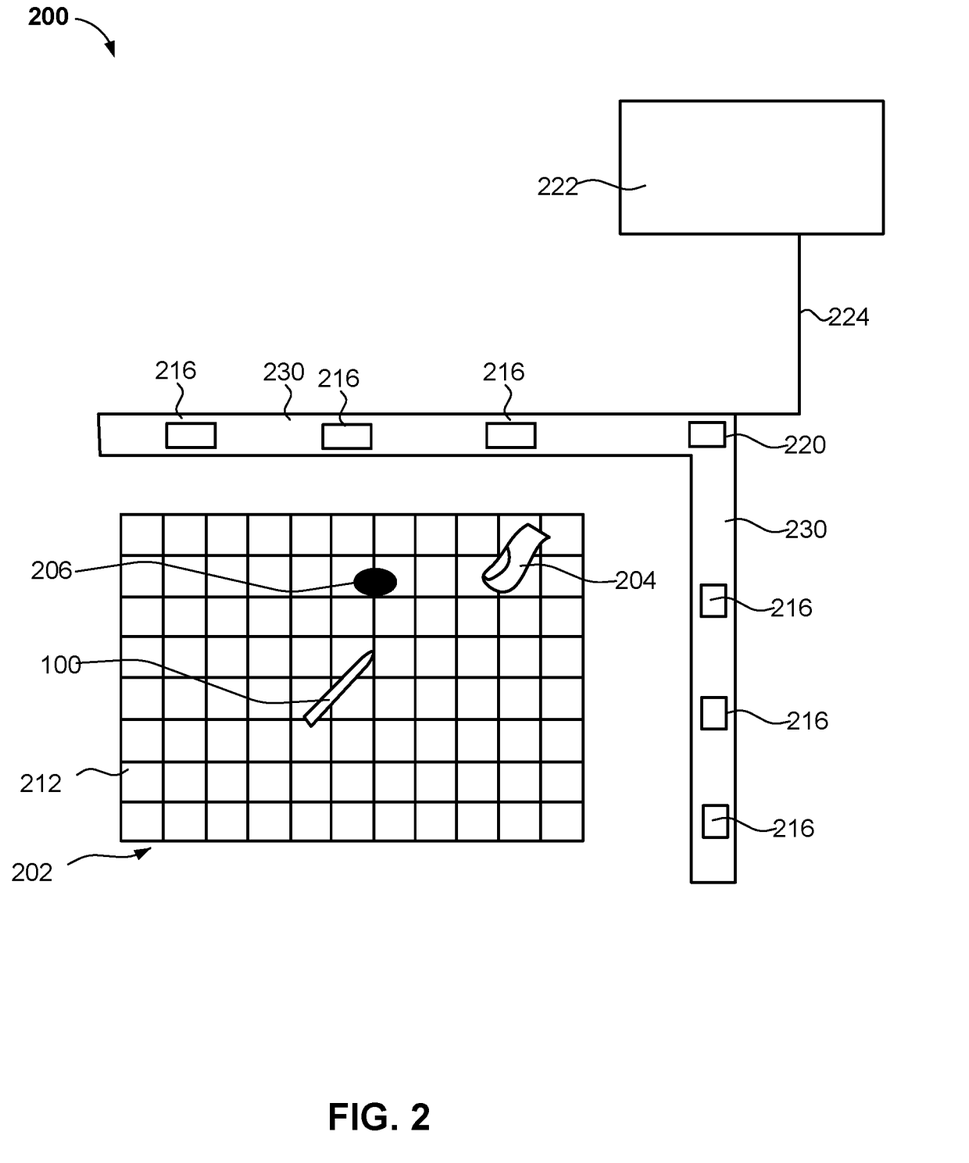
FIG. 2 is a schematic view of an example of a digitizer system for use with the pen of FIG. 1.

Referring to FIG. 2, according to an example implementation, a digitizer system or digitizer 200 may be used with any computing device to enable communications/interactions between a user and a device, e.g., personal computers (PCs), tablets, pen enabled lap-top computers, PDAs, mobile devices/user equipments (UEs), etc. In some implementations, the digitizer system 200 is part of a user interface operative to detect inputs from one or more pens 100, fingers 204, and/or conductive objects 206 and/or send outputs to one or more pens 100. The digitizer 200 may operate in a pen search mode or a pen tracking mode. In a pen search mode, the digitizer 200 may search for a signal from the pen 100, perform synchronization with the signal transmitted from the pen 100 when the signal from the pen 100 is detected or when the pen 100 comes in contact with the digitizer 200, and/or enter the tracking mode upon successful completion of the synchronization with the pen 100. The digitizer 200 remains in the tracking mode while the pen 100 maintains contact with the digitizer 200 or continues to receive the signal from the pen 100.

The digitizer system 200 may include a sensor 212 including a patterned arrangement of conductive lines (sensor lines), which may be optionally transparent, and which are typically overlaid on a display 202. For example, the sensor 212 may be a grid based sensor including horizontal and vertical lines. In some cases, a width of the conductive line may vary over its length, e.g., the width of the conductive line may be narrower around the vicinity of junction points of the grid and wider between the junction points. In some cases, the conductive lines may be shaped like a diamond shape array with diamond points matched to junction points. In some implementations, the parallel conductive lines are equally spaced straight lines, and are input to amplifiers included in application specific integrated circuit (ASIC) 216. For example, the amplifiers may be differential amplifiers.

The ASIC 216 includes, for example, circuitry to process and sample an output of the sensor and generate a digital representation. The digital output signal is forwarded to a digital unit 220, e.g., a digital ASIC unit, for further digital processing. For instance, the digital unit 220 together with the ASIC 216 may serve as a controller of the digitizer system 200 and/or may have the functionality of a controller and/or a processor. In some cases, a single unit may be used, e.g., in a small screen with limited number of lines. In some other additional or optional implementations, the ASIC 216 operates as a detection unit for processing and sampling the output of the sensor. The outcome, once determined, is forwarded to a host 222, e.g., a computer device or a host computer device, via an interface 224 for processing by the operating system or any current application. In some other cases, control functionality may be additionally or exclusively included in the host 222, and the ASIC 216 and the digital unit 220 may be provided as a single ASIC. In some other optional implementations, the digital unit 220 and the ASICs 216 may be mounted in a PCB 230.

The ASIC 216 may be connected to the outputs of the various conductive lines in the grid and functions to process the received signals at a first processing stage. In some cases, instead of the printed circuit board (PCB) 230 positioned along two sides of the sensor 212, a flex cable may be used to connect the conductive lines to the ASICs 216, e.g., positioned away from a sensing surface of the digitizer 200. As indicated above, the ASIC 216 may include one or more arrays of amplifiers, e.g., an array of differential amplifiers, an array of single ended amplifiers, or any array of differential amplifiers, and optionally including one grounded input to amplify the sensor's signals. In some other additional or optional implementations, the grounding input may be selected by the ASIC 216. The ASIC 216 may optionally include one or more filters to remove irrelevant frequencies. Additionally, filtering is performed prior to sampling. The signal is then sampled by an analog-to-digital (A/D) converter, optionally filtered by a digital filter and forwarded to digital ASIC unit, for further digital processing. Alternatively, the optional filtering is fully digital or fully analog.

For instance, the digital unit 220 receives the sampled data from the ASIC 216, reads the sampled data, processes it and determines and/or tracks the position of physical objects, such as the pen 100 and/or the finger 204, touching the digitizer sensor the 212. Further, for example, the digital unit 220 is operative to decode information encoded in a transmission signal from the pen 100, e.g., pressure on tip, right-click and/or eraser mode, color for tracing, and identification, etc. According to some implementations, hovering of an object, e.g., the pen 100, the finger 204 and/or the hand, may be detected and processed by the digital unit 220. In any case, the digital unit 220 can send a calculated position to the host 222 via an interface 224.

In some implementations, the digitizer system or digitizer 200 has several channels, i.e., interfaces included within the interface 224, with the host. In an example, the interface 224 includes a pen interface for transmitting pen coordinates on the display screen, and a finger touch interface for transmitting finger touch coordinates on the display screen. In some additional examples, a same interface of the interface 224 may transmit finger touch coordinates based on both single touch detection method and multi-touch detection method. Optionally, the interface 224 may transmit information on detected gestures.

Further, the digital unit 220 may be operative to control operation of one or more ASIC(s) 216. For instance, the digital unit 220 may be operative to provide a command signal to the ASIC 216 to switch between a plurality of available circuit paths (two or more) to connect to outputs of the various conductive lines in the grid. In some cases, the digital unit 220 together with the ASIC 216 provides for alternately connecting outputs of the various conductors to one of an array of differential amplifiers and an array of single ended amplifiers (or differential amplifiers with one grounded input). In other cases, the digital unit 220 may be operative to control triggering of one or more conductive lines. In other examples, the ASIC 216 together with the digital unit 220 provide for triggering various conductors with an oscillating signal having a selected pre-defined frequency or frequencies.

The digital unit 220 may include at least a memory unit and a processing unit to store and process information obtained from the ASIC 216. Memory and processing capability are also generally included in the host 222 and the ASIC 126. According to some implementations, memory and processing functionality may be divided between any combination of the host 222, the digital unit 220, and/or the ASIC 216. The pen 100, described above in FIG. 1 may communicate/interact with the digitizer 200 of FIG. 2 over an electrode 160 or the tip 140. The digitizer 200 may also transmit signals, for example, initiated by the host 222 or the ASIC 216, to the pen 100 via the conductive lines.

Figure 3:
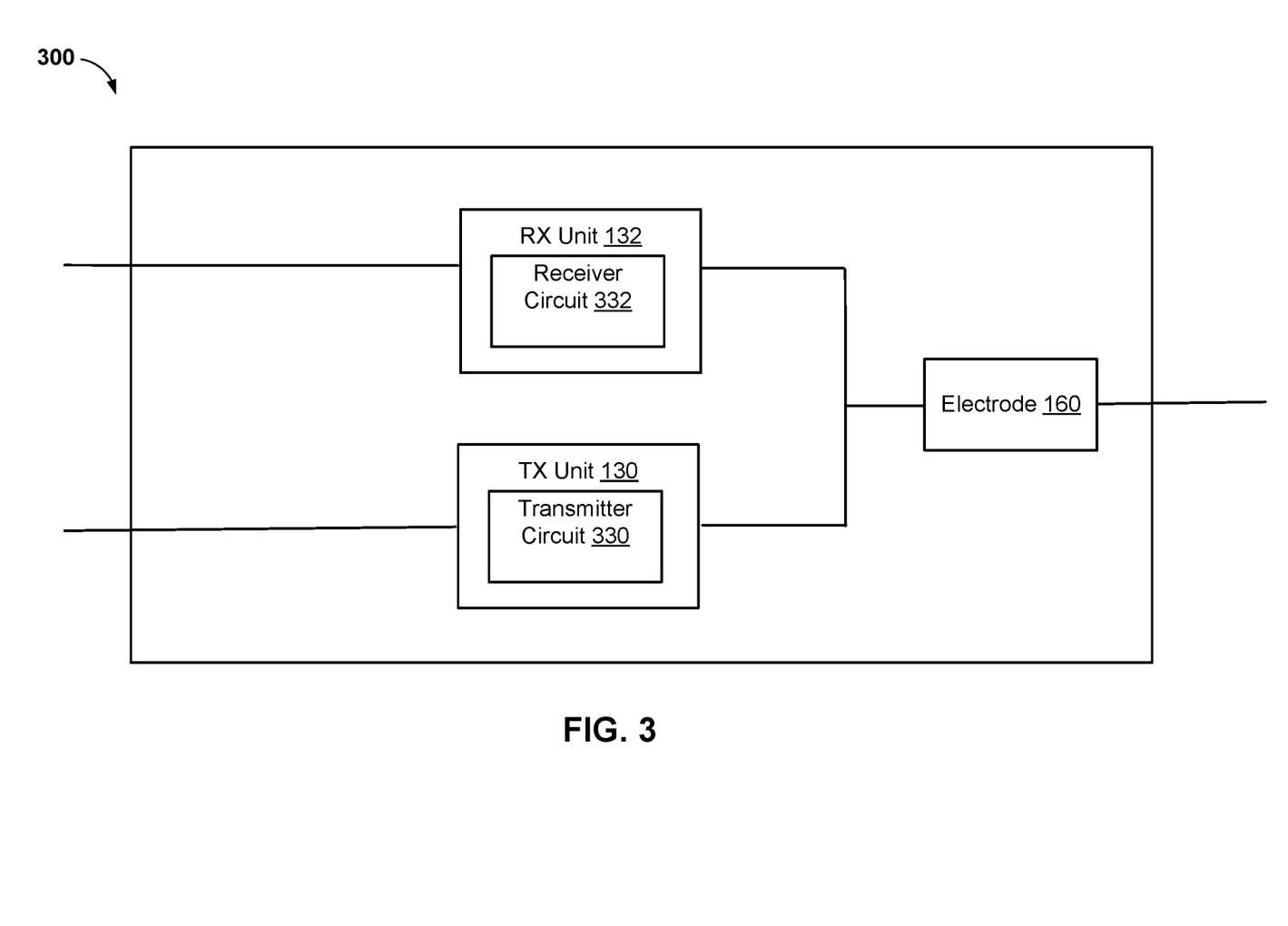
FIG. 3 is a block diagram of an example pen with a transmitter circuit, a receiver circuit, and/or an electrode.

FIG. 3 illustrates a pen 300 that shows portions of the pen 100 of FIG. 1 and FIG. 2. The pen 300 shows portions of the pen 100, where these portions include the TX unit 130 having a transmitter circuit 310, the RX unit 132 having a receiver circuit 330, and the electrode 160.

In one implementation, for example, the pen 300 may determine whether the pen 300 is to transmit information (e.g., the first information) to a digitizer (e.g., the digitizer 200 in FIG. 2) or receive information (e.g., the second information) from the digitizer. The pen 300 may determine whether the pen 300 is to transmit or receive information based on, for example, an internal state machine in a processor of the pen 300 (e.g., similar to processor 112 of pen 100). For example, if the pen 300 is to transmit the first information to the digitizer 200, the TX unit 130 which may include the transmitter circuit 330 may transmit a signal, e.g., a transmission signal, generated by the pulse generator 124 and via the electrode 160. In another example, if the pen 300 is to receive the second information from the digitizer 200, the transmitter circuit 330 may be isolated from the electrode 160, and the receiver circuit 332 may receive the second information, via the electrode 160, from the digitizer 200. The isolation of the transmitter circuit 330 from the electrode 160 to enable the receiver circuit 332 to receive the second information from the digitizer 200 via/over the electrode 160 is based on switching of a driver to a high impedance mode, and with a very low parasitic capacitance, as described in detail below in reference to FIGS. 4-7.

Figure 4:
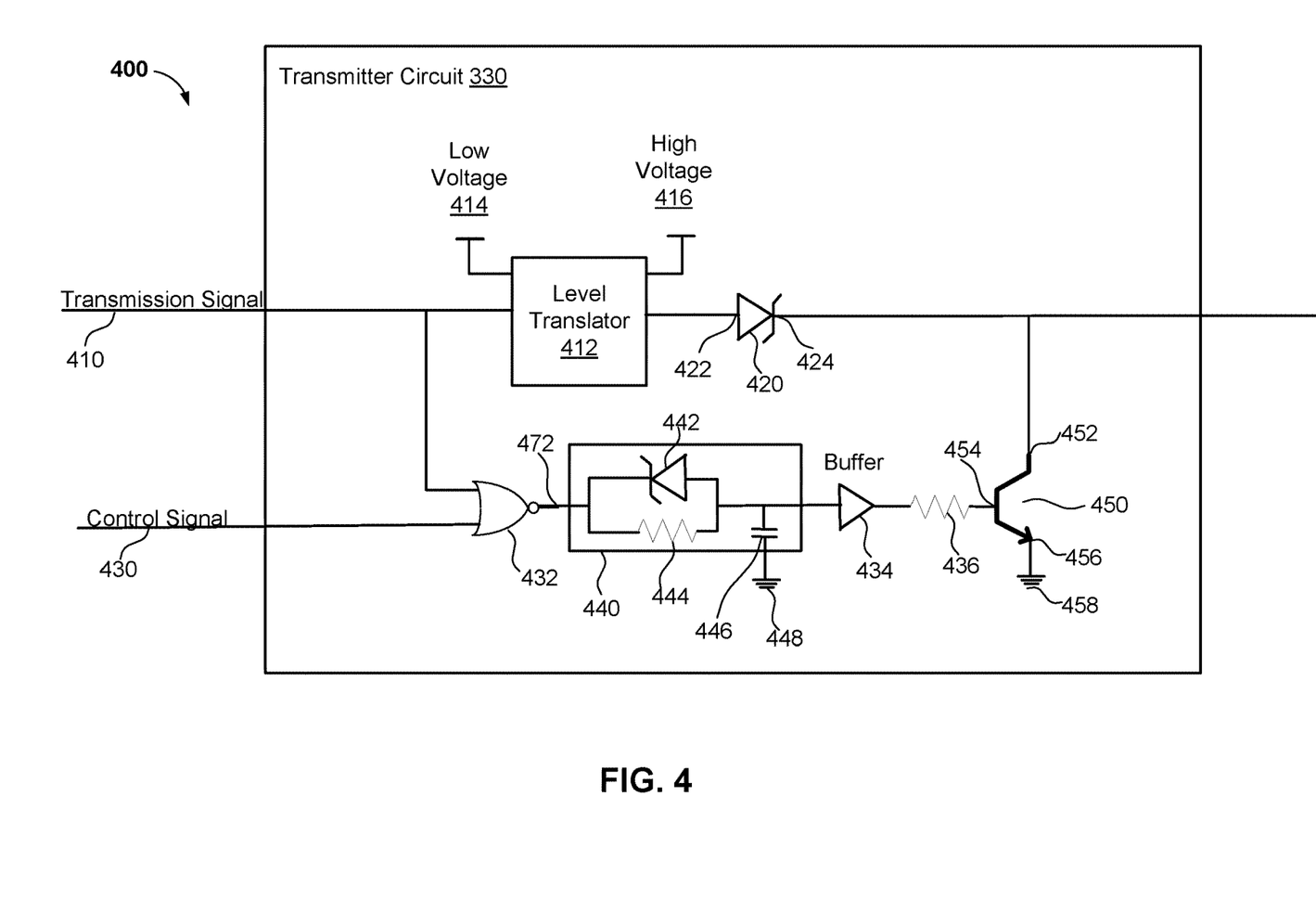
FIG. 4 illustrates an example transmitter circuit of a pen.

Referring to FIG. 4, an example transmitter circuit 330 of the pen 100 is illustrated.

For example, the transmitter circuit 330 may include at least a level translator 412, a Schottky diode 420, a NOR gate 432, a resistor-capacitor (RC) delay circuit 440, and/or a transistor 450. The level translator 412, with a low voltage input 414 and a high voltage 416, may be a high-voltage push-pull level translator that drives a high voltage signal. In this description, a high voltage signal may be referred simply as a high signal; similarly, a low voltage signal may be referred simply as a low signal. The output of the level translator 412 is connected to an anode 422 of the Schottky diode 420 and a cathode 424 of the Schottky diode 42 is connected to an output of the transmitter circuit 330. In one example, a transistor 450 may be added to the transmitter circuit 330 to drive the output of the transmitter circuit 330 low. Collector 452 of the transistor 450 may be connected to the output of the transmitter circuit 330, an emitter 456 of the transistor 450 is connected to a Ground 458, and a base (or input) 454 of the transistor 450 is connected an output of a buffer 434. As shown, the transistor 450 is a bi-polar junction transistor (BJT). In other implementations, however, the transistor 450 can be a field-effect transistor (FET), with the FET adding higher capacitance and/or introducing higher leakage current.

In one implementation, the base 454 of the transistor 450 may be controlled by an output of a logic operation, e.g., a NOR operation, with the transmission signal 410 and the control signal 430 as inputs to the logic operation. In other words, the base 454 of the transistor 450 may be controlled by the output of the logic, and the output of the transmitter circuit 330 is pulled to the Ground 458 when the input of the level translator 412 is low. However, when the input of the level translator 410 is high, the transistor 450 is not conductive and the transistor 450 may not pull the output of the transmitter circuit 330. In one example, in order to have to the ability to not pull the output of the transmitter circuit 330 output low or high (high impedance mode), a NOR gate 432 is added. The inputs of the NOR gate 432 are the input of the level translator 412 and a control signal 430. The control signal 430 may be generated by a processor of the pen 100. In another example, when the control signal 430 is low, the NOR gate 432 may act as an inverter (as described above), and may create an inverted signal 472 that controls the base 454 of the transistor 450. In a further additional example, when the control signal 430 is high (e.g., a high control signal or a high signal), the output 472 of the NOR gate 432 is low, and the transistor 450 is not conductive. Therefore, if the control signal 430 is high and the input of the level translator 412 is low, the output of the transmitter circuit 330 may be in high impedance mode, e.g., not pushed high by the level translator 412 and/or not pulled low by the transistor 450. In other words, the level translator 412 by itself would not be capable of a tri-state operation (e.g., a high impedance mode). But with the addition of the transmitter circuit 330 shown in FIG. 4, a pull down (to ground) may be performed for low voltage levels, a pull up (to source) may be performed for high voltage levels, and/or have a floating node or isolated node or high impedance node.

Further, in one implementation, an additional circuit, e.g., a resistor-capacitor (RC) delay circuit 440 is added between the NOR gate 432 and the transistor 450. The RC circuit 440 may be added to create a "break-before-make" logic to try to prevent a racing condition between propagation delays of the level translator 412 and the NOR gate 432. The racing condition, if not addressed properly, may cause the output of the transmitter circuit 330 to be driven high and low, simultaneously, during 0 1 (e.g., low signal-to-high signal) or 1 0 (e.g., high signal-to-low signal) transitions, and may lead to power waste, signal distortion, and/or potential damage to the components of transmitter circuit 330. For example, the level translator 412 may have larger propagation delay than the low voltage logic (e.g., NOR gate 432, RC delay circuit 440, transistor 450, etc.). When switching between a high transmission signal ("1") to a low transmission signal ("0"), the input of the level translator 412 will also switch from 1 to 0. The switching to 0 may result in making the transistor 450 conductive very quickly and may pull the output of the level translator 412 to the Ground 458. However, the level translator 412 which is slower may still push a high voltage because of its large propagation delay. Therefore, a contention scenario may occur in which the level translator 412 pushes a high voltage and the transistor 450 pushes a low voltage. This may make the level translator 412 take a lot of current (e.g., enough current to damage the level translator 412), and/or produce the output signal of the level translator 412 with an intermediate voltage (e.g., somewhere between a high voltage and ground voltage).

In one implementation, the RC circuit 440 may include a resistor 444 and a capacitor 446 to create an RC delay for a base signal of the transistor 450. The introduced delay is generally larger than the propagation delay of the level translator 412. Further, a Schottky diode 442 is added in parallel to the resistor 444 in order to introduce the delay only in a 1 0 transition of the output signal, and not introduce the delay in a 0 1 transition. This may result in the level translator 412 being faster in a 1 0 transition or slower in a 0 1 transition. The Schottky diode 442 may have a very low impedance in one direction of current (e.g., anode to cathode, 422 424), but a very high impedance in the other direction (e.g., cathode to anode, 424 422). So in a 1 0 transition, the output of the NOR gate 432 may transitions between 0 and 1. The Schottky diode 442 is then in reverse voltage and has a high impedance resulting in the RC delay. In a 0 1 transition, the output 472 of the NOR 432 gate transitions between 1 and 0. The Schottky diode 442 is then in forward voltage, and has very low impedance. As the Schottky diode is in parallel to the resistor 444, their equivalent resistance is very low, and the delay is very low (e.g., almost non-existent). However, the faster/slower transitions may be also due to the level translator 412 having a larger propagation delay than the NOR gate 432.

Furthermore, in one implementation, the buffer 434 may be added between the RC delay circuit 440 and the transistor 450 to put the transistor 450 in saturation (for optimal conductivity). However, the series resistor 436 connected to the base 454 of the transistor 450 should not be too big in order to allow sufficient current to flow to the base 454 of the transistor 450. In one example, if the resistor 444 in the RC circuit 440 is used to drive the base 454 of the transistor 450, the capacitor 446 can be chosen such that the capacitance is large enough to introduce the required delay. Additionally, the capacitor 446 may be constantly charging/discharging, and may consume significant current. Therefore, the RC 440 that includes a large resistor and a small capacitor may be used. Further, the buffer 434 is added so that the base 454 of the transistor 450 may be driven using the resistor 436 of a lower resistance.

Figure 5:
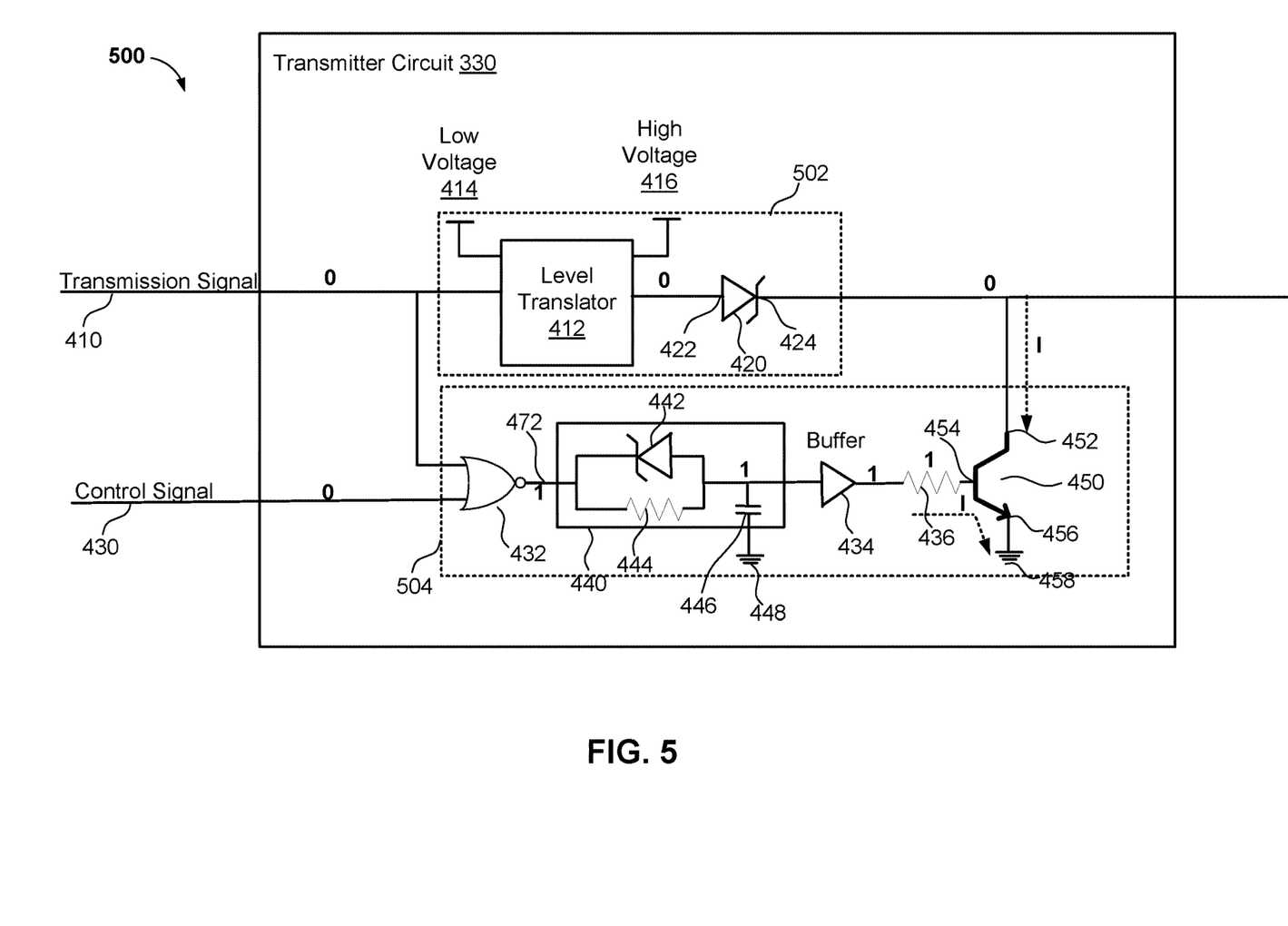
FIG. 5 illustrates an example transmitter circuit that is driving a low voltage on the electrode.

In FIG. 5, an example operation 500 of the transmitter circuit 330 is shown for driving a low voltage (e.g., low signal) on the electrode. For example, the transmitter circuit 330 may include a first path 502 with the level translator 412 and other components, and a second path 504 with the NOR gate 432 and other components. The transmission signal 410 may be a low transmission signal, indicated by "0" (511), and provided to the level translator 412 and the NOR gate 432, and the control signal 430 may be a low control signal, indicated by "0" (531), provided to the NOR gate 432. In one implementation, the output on the first path 502 may be a low signal, indicated by "0" (513), and the output on the second path 504 may be a high signal, indicated by "1" (572). The output (572) of the second path 504 acts as an input, indicated by "1" (537) to the base 454 of the transistor 450 which turns "ON" or enables the transistor 450. This may result in the providing the low transmission signal, indicated by "0" (515) to the electrode, and driving the current "I" 539 to the Ground 458.

Figure 6:
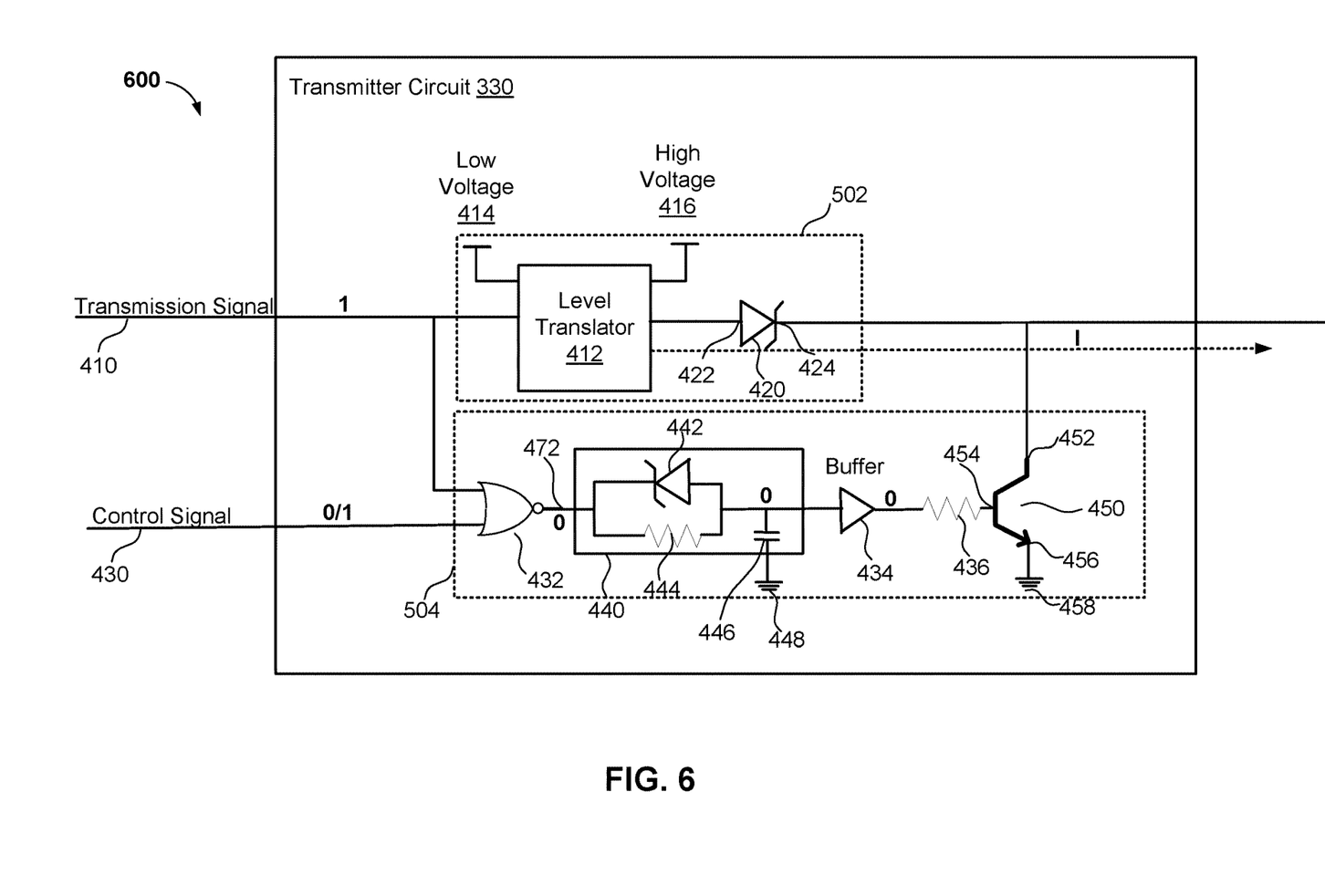
FIG. 6 illustrates an example transmitter circuit that is driving a high voltage on the electrode.

In FIG. 6, an example operation 600 of the transmitter circuit 330 is shown for driving a high voltage (e.g., a high signal) on the electrode. For example, the transmitter circuit may include the first path 502 with the level translator 412 and other components, and the second path 504 with the NOR gate 432 and other components. The transmission signal 410 may be a high transmission signal, indicated by "1" (611), and provided to the level translator 412 and the NOR gate 432, and the control signal 430 may be a high control signal or a low control, indicated by "0/1" (631), and provided to the NOR gate 432. In one implementation, the output on the first path 502 may be a high signal, indicated by "1" (613), and driving current "I" (619) through the Schottky diode 420 and to the electrode 160. The output on the second path 504 is a low signal, indicated by "0" (672). The output 672 of the second path 504 acts as an input, indicated by "0" (637), to the base 454 of the transistor 450 resulting in the transistor 450 being turned "OFF" or disabled.

Figure 7:
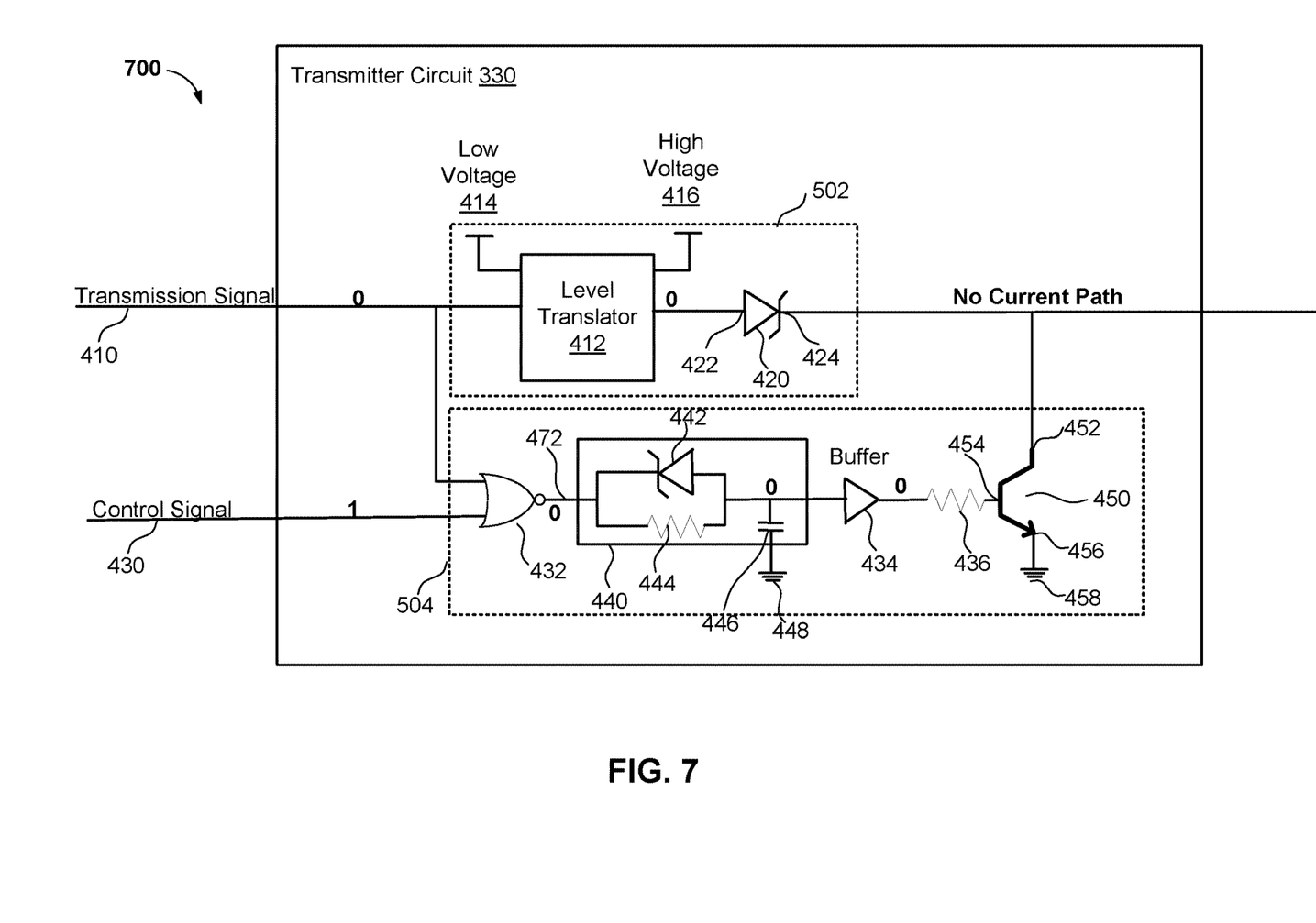
FIG. 7 is illustrates an example transmitter circuit that is isolated from the electrode.

In FIG. 7, an example operation 700 of the transmitter circuit 330 is shown for isolating the transmitter circuit 330 from the electrode. For example, the transmitter circuit may include the first path 502 with the level translator 412 and the second path 504 with the NOR gate 432. The transmission signal 410 may be a low transmission signal, indicated by "0" (711) and provided to the level translator 412 and the NOR gate 432, and the control signal 430 may be a high control signal, indicated by "1" (731) provided to the NOR gate 432. In one implementation, the output on the first path 502 may be a low signal, indicated by "0" (713), and the output on the second path 504 may be a low signal, indicated by "0" (772). The output 772 of the second path 504 acts as an input, indicated by "0" (737), to the base 454 of the transistor 450. This may result in the transmitter circuit 330 being isolated from the electrode 160 as there is no current path. In other words, when the output of the first path 502 and the second 504 are determined as low signals, indicated by "0"s (713 and 772), the electrode 160 is isolated form the transmitter circuit 330, and the pen 100 may receive the second information over the receiver circuit 332.

Figure 8:
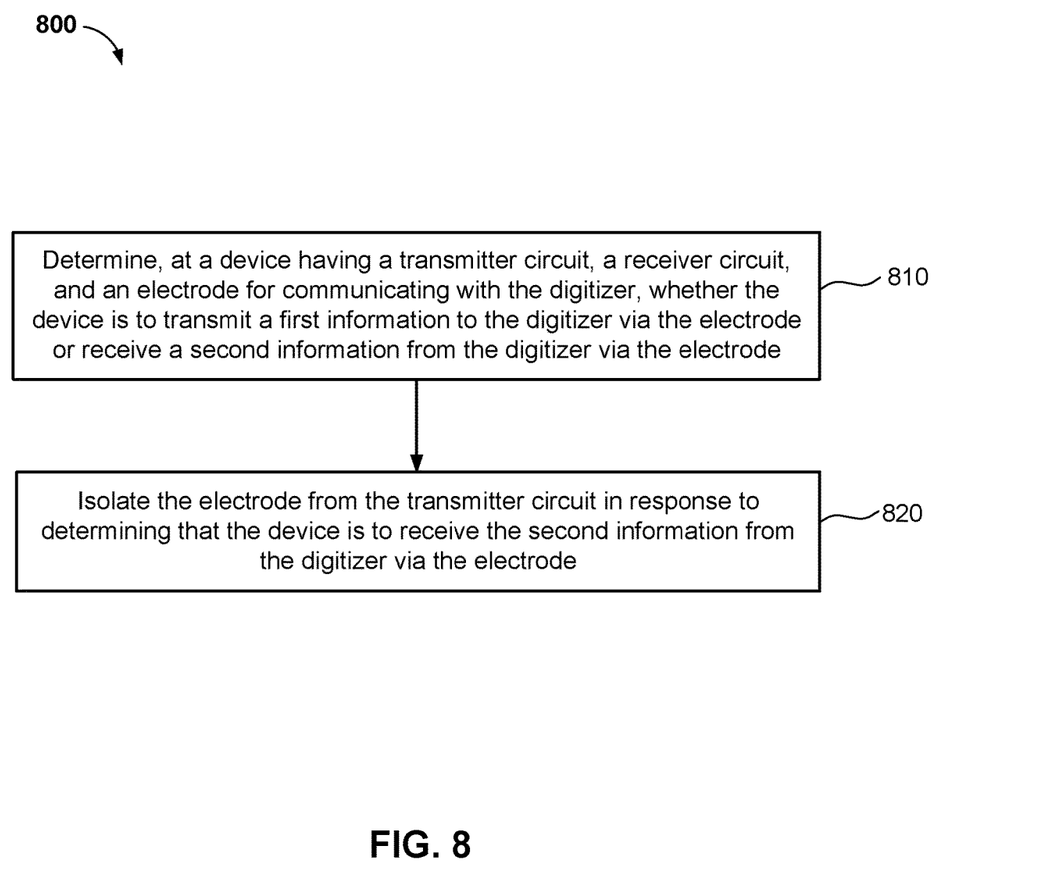
FIG. 8 is a flowchart of an example method of the operation of a pen, including a method of communicating with the digitizer.

Referring to FIG. 8, an example of one implementation of a method 800 performed by pen 100 for communicating or interacting with digitizer 200 is described.

For example, at block 810, method 800 includes determining, at a device having a transmitter circuit, a receiver circuit, and an electrode for communicating with the digitizer, whether the device is to transmit a first information to the digitizer via the electrode or receive a second information from the digitizer via the electrode. For example, the device (e.g., pen 100 of FIG. 1), based on an internal state machine in the processor of the pen 100, may determine whether the pen 100 is to transmit a first information (e.g., transmit first information from the pen 100 to the digitizer 200) or receive a second information (e.g., receive the second information from the digitizer 200) via the electrode 160.

The pen 100 may include one or more electrodes. In one example, when the pen 100 includes one electrode, the pen 100 determines whether the pen 100 is to transmit the first information to the digitizer 200 or receive the second information from the digitizer 200 as the same electrode, e.g., electrode 160, is shared between the TX unit 130/transmitter circuit 330 and RX unit 132/receiver circuit 332. The electrode 160 may be shared in a time division multiplexing (TDM) manner. In another example, the pen 100 may contain multiple electrodes, e.g., two electrodes, and the pen 100 may use one electrode for transmitting and another electrode for receiving, either simultaneously or in a TDM manner. For instance, the pen 100 may transmit on one electrode and receive on another electrode simultaneously if the electrode are sufficiently insulated from each other (e.g., one electrode on the tip 140 and another electrode on the tail), or operating in different frequency bands. In a further additional example, the pen 100 may use both the electrodes simultaneously, but both the electrodes are either for transmitting or both the electrodes are for receiving if the electrodes are sufficiently insulated from each other and/or operating in different frequency bands.

At block 820, method 800 further includes isolating the electrode from the transmitter circuit in response to determining that the device is to receive the second information from the digitizer via the electrode. For example, the device, e.g., pen 100, may isolate the electrode 160 from the transmitter circuit 330 (or the TX unit 130) in response to determining that the device is to receive the second information from the digitizer 200.

Additionally, the isolating of the electrode 160 from the transmitter circuit 330 may include enabling the receiver circuit 332 of the pen 100 to receive and process the second information received from the digitizer 200 via the electrode 160.

In one implementation, the transmitter circuit 330 may receive a high transmission signal 410 and/or a control signal 430 (the control signal 430 may be a high or a low signal). The transmitter circuit 330 may transmit a high voltage (FIG. 6) on the electrode 160 when the transmission signal 410 is a high signal. In another implementation, the transmitter circuit 330 may receive a low transmission signal 410 and a high or a low control signal 430. In one example, the transmitter circuit 330 may perform a logic operation (e.g., a NOR operation) on the low transmission signal 410 and the high control signal 430. The output of the logic operation may be a low signal and may result in the pen 100 isolating the electrode 160 from the transmitter circuit 330 (FIG. 7). This allows the receiver circuit 332 to receive the second information from the digitizer 200. In another example, the transmitter circuit 330 may perform a logic operation (e.g., a NOR operation) on the low transmission signal 410 and the low control signal 430. The output of the logic operation may be a low signal and may result in the pen 100 driving a low voltage on the electrode 160.

The method 800 described above provides for the TX unit 130/transmitter circuit 330 and RX unit 132/receiver circuit 332 share the electrode 160 in the pen 100 for communicating/interacting with the digitizer 200.

As used in this application, the terms "component," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various implementations are described herein in connection with a device, which can be a wired device or a wireless device. Such devices may include, but are not limited to, a gaming device or console, a laptop computer, a tablet computer, a personal digital assistant, a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Various implementations or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

The various illustrative logics, logical blocks, and actions of methods described in connection with the embodiments disclosed herein may be implemented or performed with a specially-programmed one of a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more components operable to perform one or more of the steps and/or actions described above.

Further, the steps and/or actions of a method or algorithm described in connection with the implementations disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some implementations, the processor and the storage medium may reside in an ASIC. Additionally, the ASIC may reside in a computer device (such as, but not limited to, a game console). In the alternative, the processor and the storage medium may reside as discrete components in a user terminal. Additionally, in some implementations, the steps and/or actions of a method or algorithm may reside as one or any combination or set of codes and/or instructions on a machine readable medium and/or computer readable medium, which may be incorporated into a computer program product.

In one or more implementations, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. Disk and disc, as used herein, includes compact disc (CD), laser disc, optical disc, digital versatile disc (DVD), floppy disk and Blu-ray disc where disks usually reproduce data magnetically, while discs usually reproduce data optically with lasers. Combinations of the above should also be included within the scope of computer-readable media.

While implementations of the present disclosure have been described in connection with examples thereof, it will be understood by those skilled in the art that variations and modifications of the implementations described above may be made without departing from the scope hereof. Other implementations will be apparent to those skilled in the art from a consideration of the specification or from a practice in accordance with implementations disclosed herein.

What is claimed is:

1. A method of communicating by a device with a digitizer, comprising:
   receiving, by an input of a level translator of a transmitter circuit of the device, a transmission signal for communicating with the digitizer, wherein the level translator is configured to drive a level translator output based on the transmission signal;
   receiving, by two inputs of a logic device of the transmitter circuit, the transmission signal and a control signal from a processor of the device;
   performing, by the logic device, a logic operation on the transmission signal and the control signal, wherein the logic device is configured to generate a logic output based on the transmission signal and the control signal;
   determining, by the transmitter circuit based on the logic output of the logic device and the level translator output of the level translator, that a receiver circuit of the device will receive first information from the digitizer via an electrode of the device; and
   isolating, by the transmitter circuit in response to determining that the receiver circuit will receive the first information, the transmitter circuit from the electrode to prevent the transmitter circuit from transmitting second information to the digitizer via the electrode.

2. The method of claim 1, wherein isolating the transmitter circuit from the electrode comprises configuring the level translator to be in a low transmission signal mode.

3. The method of claim 1, wherein the transmitter circuit includes a transistor configured to receive the logic output of the logic device, and wherein isolating the transmitter circuit from the electrode comprises configuring the transistor to be in a high impedance mode.

4. The method of claim 3, wherein the transmitter circuit further includes a delay circuit, wherein the method further comprises preventing, by the delay circuit, an output of the transmitter circuit from being simultaneously driven high and low.

5. The method of claim 4, further comprising delaying, by the delay circuit, the logic output of the logic device to a transistor input of the transistor.

6. The method of claim 1, further comprising:
   determining, based on the logic output of the logic device, that the transmitter circuit will transmit the second information to the digitizer; and
   driving a current via the transmitter circuit and the electrode for communicating the second information with the digitizer.

7. The method of claim 1, further comprising:
   controlling the transmitter circuit and the receiver circuit for communicating with the digitizer over the electrode using time division multiplexing.

8. The method of claim 1, wherein isolating the transmitter circuit from the electrode includes enabling the receiver circuit to receive the first information from the digitizer via the electrode.

9. The method of claim 1, wherein the device comprises a stylus.

10. A device for communicating with a digitizer, comprising:
    a processor;
    an electrode configured to communicate with the digitizer;
    a receiver circuit communicatively coupled with the processor and the electrode and configured to receive first information from the digitizer via the electrode; and
    a transmitter circuit communicatively coupled with the processor and the electrode and configured to:
       receive, by an input of a level translator of the transmitter circuit, a transmission signal for communicating with the digitizer, wherein the level translator is configured to drive a level translator output based on the transmission signal;
       receive, by two inputs of a logic device of the transmitter circuit, a control signal from the processor;
       perform, by the logic device, a logic operation on the transmission signal and the control signal, wherein the logic device is configured to generate a logic output based on the transmission signal and the control signal;
       determine, by the transmitter circuit based on the logic output of the logic device and the level translator output of the level translator, that the receiver circuit will receive the first information from the digitizer via the electrode; and
       isolate, by the transmitter circuit in response to determining that the receiver circuit will receive the first information, the transmitter circuit from the electrode to prevent the transmitter circuit from transmitting second information to the digitizer via the electrode.

11. The device of claim 10, wherein the level translator is configured in a low transmission signal mode when the transmitter circuit is isolated from the electrode.

12. The device of claim 10, wherein the transmitter circuit includes a transistor configured in a high impedance mode when the transmitter circuit is isolated from the electrode.

13. The device of claim 12, wherein the transmitter circuit further includes a delay circuit configured to prevent an output of the transmitter circuit from being simultaneously driven high and low.

14. The device of claim 13, wherein the delay circuit is further configured to delay the logic output of the logic device to a transistor input of the transistor.

15. The device of claim 10, wherein the transmitter circuit is further configured to:
- determine, based on the logic output of the logic device, that the transmitter circuit will transmit the second information to the digitizer; and
- drive a current via the transmitter circuit and the electrode for communicating the second information with the digitizer.

16. The device of claim 10, wherein the processor is configured to control the transmitter circuit and the receiver circuit for communicating with the digitizer over the electrode using time division multiplexing.

17. The device of claim 10, wherein the receiver circuit is further configured to be enabled to receive the first information from the digitizer via the electrode when the transmitter circuit is isolated from the electrode.

18. The device of claim 10, wherein the device comprises a stylus.

* * * * *